(12) United States Patent
Park

(10) Patent No.: US 7,807,569 B2
(45) Date of Patent: Oct. 5, 2010

(54) METHOD OF MANUFACTURING A CONTACT STRUCTURE FOR A SEMICONDUCTOR DEVICE

(75) Inventor: Je-Min Park, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/397,190

(22) Filed: Mar. 3, 2009

(65) Prior Publication Data

US 2009/0176357 A1 Jul. 9, 2009

Related U.S. Application Data

(62) Division of application No. 10/875,008, filed on Jun. 22, 2004, now Pat. No. 7,518,245.

(30) Foreign Application Priority Data

Jun. 25, 2003 (KR) ................ 2003-41333

(51) Int. Cl.
*H01L 21/44* (2006.01)

(52) U.S. Cl. ............... 438/668; 257/759; 257/E21.507; 438/233; 438/244; 438/253; 438/638; 438/667

(58) Field of Classification Search ................ 438/253, 438/233, 244, 638, 666–668; 257/759, E21.507
See application file for complete search history.

(56) References Cited

U.S. PATENT DOCUMENTS

| | | | |
|---|---|---|---|
| 5,442,236 A | 8/1995 | Fukazawa | |
| 5,759,914 A | 6/1998 | Park | |
| 5,760,429 A | 6/1998 | Yano et al. | |
| 6,010,933 A | 1/2000 | Cherng | |
| 6,071,799 A | 6/2000 | Park et al. | |
| 6,091,154 A | 7/2000 | Ohkawa | |
| 6,184,126 B1 | 2/2001 | Lee et al. | |
| 6,251,790 B1 | 6/2001 | Jeong | |

(Continued)

FOREIGN PATENT DOCUMENTS

JP 8-236729 9/1996

(Continued)

OTHER PUBLICATIONS

English language abstract of Korean Patent Publication No. 10-0200697.

(Continued)

*Primary Examiner*—Wael M Fahmy
*Assistant Examiner*—John C Ingham
(74) *Attorney, Agent, or Firm*—Harness, Dickey & Pierce, P.L.C.

(57) ABSTRACT

In one embodiment, a semiconductor device comprises a conductive pad formed in a semiconductor substrate. The semiconductor device further includes a conductive pattern overlying a peripheral region of the conductive pad. The conductive pattern has an opening to expose another region of the conductive pad. The semiconductor device also includes a conductive contact extending through the opening. The conductive contact is electrically connected to the conductive pad. As a result, manufacturing cost for the semiconductor device may be reduced while manufacturing throughput may be improved.

11 Claims, 18 Drawing Sheets

U.S. PATENT DOCUMENTS

| | | |
|---|---|---|
| 6,291,335 B1 | 9/2001 | Schnabel et al. |
| 6,451,651 B1 | 9/2002 | Park et al. |
| 2001/0005624 A1 | 6/2001 | Aoyagi et al. |
| 2002/0123193 A1 | 9/2002 | Yang et al. |
| 2003/0057562 A1 | 3/2003 | Tsukamoto |

FOREIGN PATENT DOCUMENTS

| | | |
|---|---|---|
| KR | 10-0200697 | 3/1999 |
| KR | 2002-0065795 | 8/2002 |

OTHER PUBLICATIONS

English language abstract of Korean Patent Publication No. 2002-0065795.

English language abstract of Japanese Patent No. 8-236729.

US 7,807,569 B2

METHOD OF MANUFACTURING A CONTACT STRUCTURE FOR A SEMICONDUCTOR DEVICE

CROSS REFERENCE TO RELATED APPLICATION

This application is a Divisional of U.S. patent application Ser. No. 10/875,008, filed on Jun. 22, 2004, now pending, which claims priority under 35 U.S.C. §119 from Korean Patent Application No. 2003-41333, filed on Jun. 25, 2003, in the Korean Intellectual Property Office, the entire contents of which are hereby incorporated by reference

BACKGROUND OF THE INVENTION

1. Field of the Invention

This disclosure relates to a semiconductor device and a method of manufacturing the semiconductor device. More particularly, this disclosure relates to a contact structure of a semiconductor memory device and a method of manufacturing the same.

2. Description of the Related Art

As semiconductor manufacturing technologies have been developed, semiconductor devices having high storage capacities have been widely employed in various electronic or electric apparatuses. Particularly, DRAM devices such as those containing single unit cells having one transistor and one capacitor have greatly improved in cell density. As cell density has increased, contact holes for connecting an upper conductive layer to a lower conductive layer have become smaller, whereas interlay insulating layers between the conductive layers have become thicker. Since the contact hole has a high aspect ratio (a ratio of a height of the contact hole respect to a width thereof), the process margin of a photolithography process for forming the contact hole has been reduced so that a minute contact hole may not be formed using a conventional semiconductor manufacturing technique. The solution has been to include landing pads in a DRAM device to reduce the aspect ratio of contact holes. Additionally, a self-aligned contact (SAC) structure was developed to form minute contacts in semiconductor devices having minute patterns of below about 0.1 µm, without failure of the semiconductor devices.

For example, Korean Patent No. 200,697 discloses a method of manufacturing a semiconductor device without a failure of a metal contact. According to the method, a guard ring is formed at the peripheral portion of a bit line to prevent the failure of the metal contact relative to the bit line.

In addition, U.S. Pat. No. 6,451,651 discloses a method of manufacturing a semiconductor device in which a metal contact is connected to a landing pad in a peripheral/core area of a semiconductor substrate by a self-alignment process.

FIGS. 1A to 1F are cross-sectional views illustrating a conventional method of manufacturing a semiconductor device in accordance with the above-mentioned U.S. patent. In FIGS. 1A to 1F, 'P' indicates a peripheral/core area of the semiconductor device, and 'C' represents a cell area of the semiconductor device.

Referring to FIGS. 1A and 1B, after a gate insulation layer is formed on a semiconductor substrate 10 having an isolation layer thereon, a polysilicon layer, a metal silicide layer and a gate capping layer are successively formed on the gate insulation layer.

The gate capping layer, the metal silicide layer and the polysilicon layer are sequentially etched by a photolithography process to thereby form gate patterns 15 on the semiconductor substrate 10. After spacers are formed on sidewalls of the gate patterns 15, impurities are implanted at portions of the substrate 10 between the gate patterns 15 to form source/drain regions. As a result, transistors including the gate patterns 15 and the source/drain regions are formed on the substrate 10.

A silicon oxide layer is formed on the substrate 10 having the transistors thereon, and then the silicon oxide layer is planarized to form a first interlayer insulating layer 20 on the transistors and on the substrate 10. The first interlayer insulating layer 20 is etched to form contact holes that expose the portions of the substrate 10 between the gate patterns 15 in the cell area C.

After a conductive layer of polysilicon is formed on the first interlayer insulating layer 20 to fill the contact holes, the conductive layer and the first interlayer insulating layer 20 are partially etched to form a bit line contact pad 25 and a storage node contact pad 30 on the substrate 10.

A second interlayer insulating layer 35 is formed on the contact pads 25 and 30 and on the first interlayer insulating layer 20, and then a first etch stop layer 40 is formed on the second interlayer insulating layer 35.

The first etch stop layer 40 and the second interlayer insulating layer 35 are etched to form a bit line contact hole exposing the bit line contact pad 25 in the cell area C. Here, the contact holes exposing portions of the substrate 10, which correspond to a bit line contact part and a metal contact part, are formed in the peripheral/core area P.

A metal barrier layer 45 is formed in the bit line contact hole of the cell area C and in the contact holes of the peripheral/core area P. After a metal layer is formed to fill the bit line contact hole of the cell area C and the contact holes of the peripheral/core area P, the metal layer is etched by a chemical mechanical polishing (CMP) process so that a bit line contact plug 50 is formed in the bit line contact hole of the cell area C, and metal contact pads 55 are formed in the contact holes of the peripheral/core area P, respectively.

Portions of the first etch stop layer 40 are removed except for a portion of the first etch stop layer 40 positioned adjacent to the metal contact pads 55 in the peripheral/core area P. After a nitride layer 60 and a bit line conductive layer 65 are formed on the whole surface of the substrate 10, the nitride layer 60 and the bit line conductive layer 65 are etched to form bit line patterns on the second interlayer insulating layer 35. Here, after a subsidiary oxide layer 70 and a sacrificial layer 75 are formed on the bit line conductive layer 65, the sacrificial layer 75, the subsidiary oxide layer 70, the bit line conductive layer 65 and the nitride layer 60 are successively etched by a photolithography process to thereby form the bit line patterns on the second interlayer insulating layer 35.

After forming a third interlayer insulating layer 80 on the bit line patterns, the third interlayer insulating layer 80 is planarized until the sacrificial layer 75 is exposed. In the peripheral/core area P, a bit line pattern connected to the bit line contact plug 50 has a relatively narrow width, whereas a bit line pattern connected to a metal contact plug has a relatively wide width.

Referring to FIG. 1C, the sacrificial layer 75 and the subsidiary oxide layer 70 on the bit line patterns are selectively etched to expose the bit line conductive layer 65. Hence, grooves 85 exposing the bit line patterns are formed on the third insulating layer 80.

Referring to FIG. 1D, after a nitride layer is formed on the third interlayer insulating layer 80 to fill the grooves 85, the nitride layer is etched to form nitride layer patterns 90 that fill the grooves 80. Here, a spacer 95 is formed on a sidewall of the groove 85 exposing the bit line pattern of the relatively wide width in the peripheral/core area P.

An additional oxide layer 100 and a second etch stop layer 105 are successively formed on the bit line pattern of the relatively wide width, on the nitride layer pattern 90, on the spacer 95 and on the third interlayer insulating layer 80.

The second etch stop layer 105, the additional oxide layer 100, the third interlayer insulating layer 80 and the second interlayer insulating layer 35 are partially etched in the cell area C, thereby forming a storage node contact hole that exposes the storage node contact pad 30. A conductive material is filled in the storage node contact hole to form a storage node contact plug 110 in the storage node contact hole.

Referring to FIG. 1E, after forming a storage node 115 connected to the storage node contact plug 110 using a mold oxide layer, a dielectric layer 120 and a plate electrode 125 are successively formed on the storage node 115 to complete a capacitor in the cell area C.

After completing the capacitor in the cell area C, the second etch stop layer 105 on the peripheral/core area P is removed. Then, a fourth interlayer insulating layer 130 is formed over the substrate 10 including the cell area C and the peripheral/core area P.

Referring to FIG. 1F, the fourth interlayer insulating layer 130 and the third interlayer insulating layer 80 are etched to form contact holes exposing the plate electrode 125, the metal contact pad 55 and the bit line patterns. When a conductive material is filled in the contact holes, metal contact plugs 135, 140 and 145 are formed in the contact holes, respectively. The metal contact plugs 135, 140 and 145 connect upper wirings to the underlying conductive structures.

In the above-described method of forming a semiconductor device, it is desirable to increase the thickness of the nitride patterns to ensure a high process margin for forming the bit line patterns. However, increasing the thickness of the nitride patterns also excessively increases the thickness of the bit lines. Since intervals between the bit lines are very small in the semiconductor device having a design rule of below about 0.1 μm, the aspect ratios of the bit lines are thus greatly increased. As a result, the bit lines may be electrically shorted. In addition, because several additional layers are formed on the bit line patterns so as to form the metal contact plugs by the self-alignment process, the semiconductor manufacturing process is more complicated. Furthermore, the underlying conductive structures may be damaged because several etching s are performed to form the metal contact plugs.

Meanwhile, since the size of the landing pad in the peripheral/core area has been reduced because DRAM devices are high density, an overlap margin for forming a metal contact relative to the landing pad is also greatly decreased. Although the design rule of the peripheral/core area may be increased to overcome this problem, there is a tradeoff in that throughput of the DRAM device manufacturing process may be reduced.

SUMMARY OF THE INVENTION

A semiconductor device comprises a conductive pad formed in a semiconductor substrate. The semiconductor device further includes a conductive pattern overlying a peripheral region of the conductive pad. The conductive pattern has an opening to expose another region of the conductive pad. The semiconductor device also includes a conductive contact extending through the opening. The conductive contact is electrically connected to the conductive pad.

BRIEF DESCRIPTION OF THE DRAWINGS

The above and other advantages of embodiments of the present invention will become readily apparent by reference to the following detailed description when considered in conjunction with the accompanying drawings wherein.

DESCRIPTION OF THE PREFERRED EMBODIMENTS

Figure 1A:
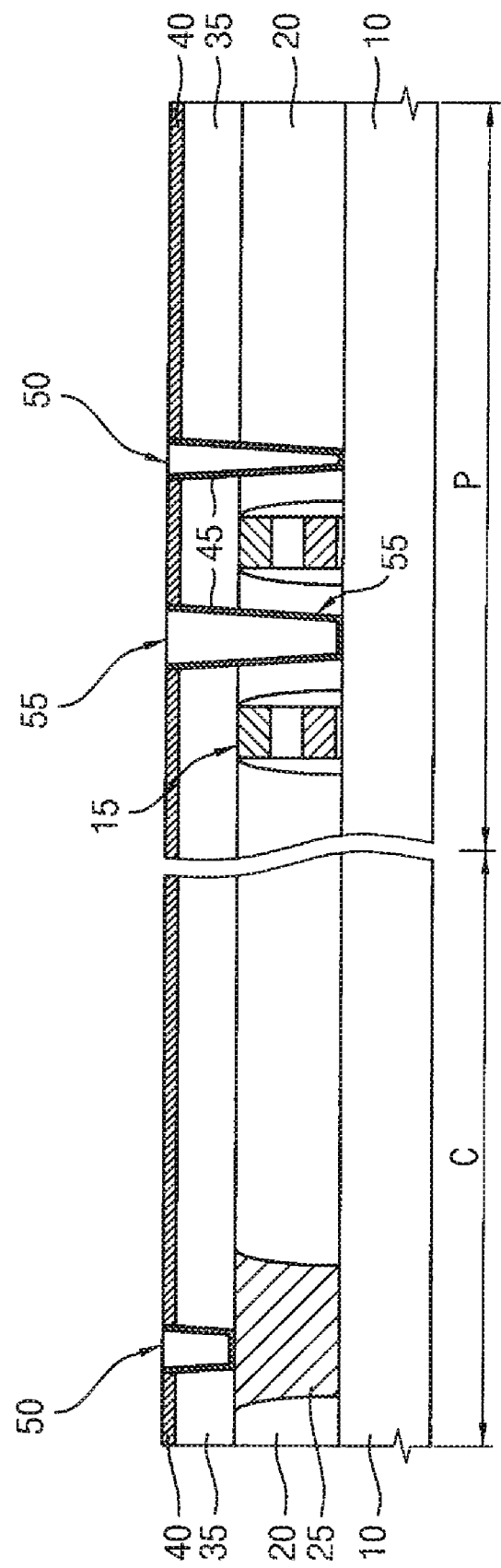
FIGS. 1A to 1F are cross-sectional views illustrating a conventional method of manufacturing a semiconductor device.
Figure 1B:
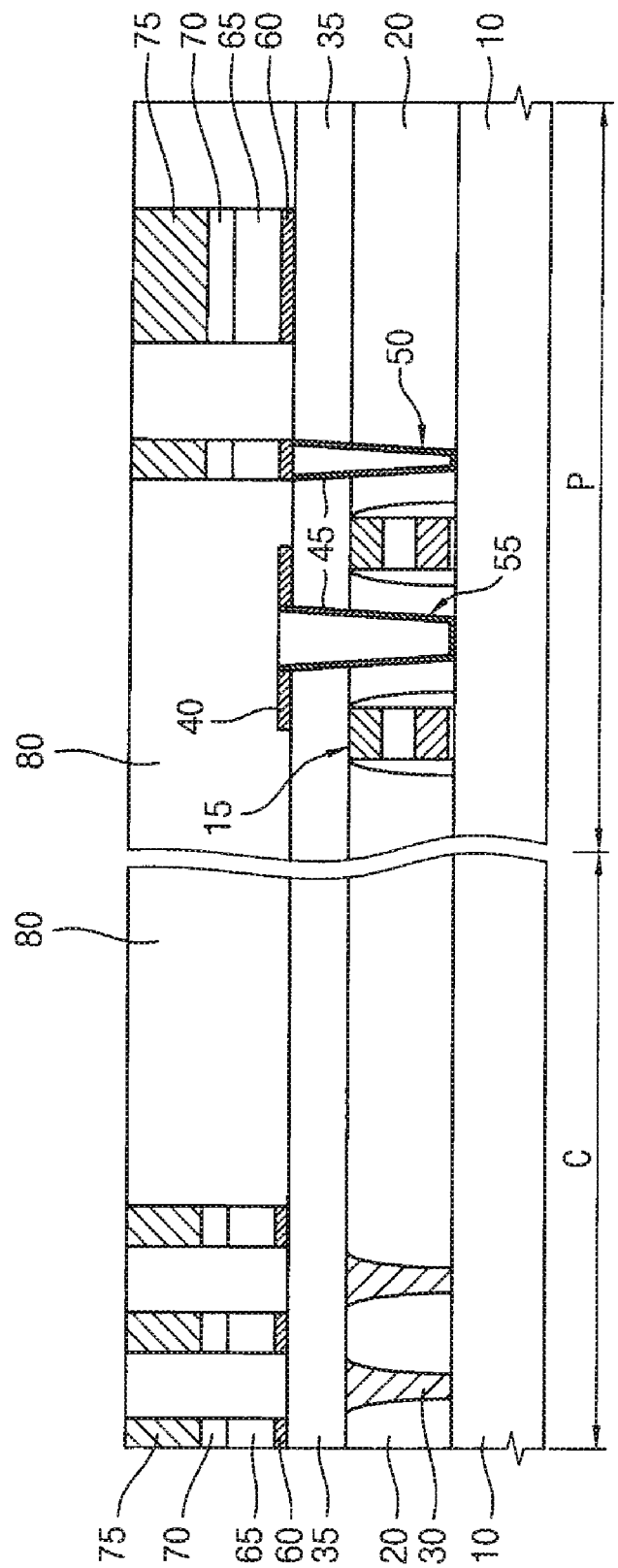
Figure 1C:
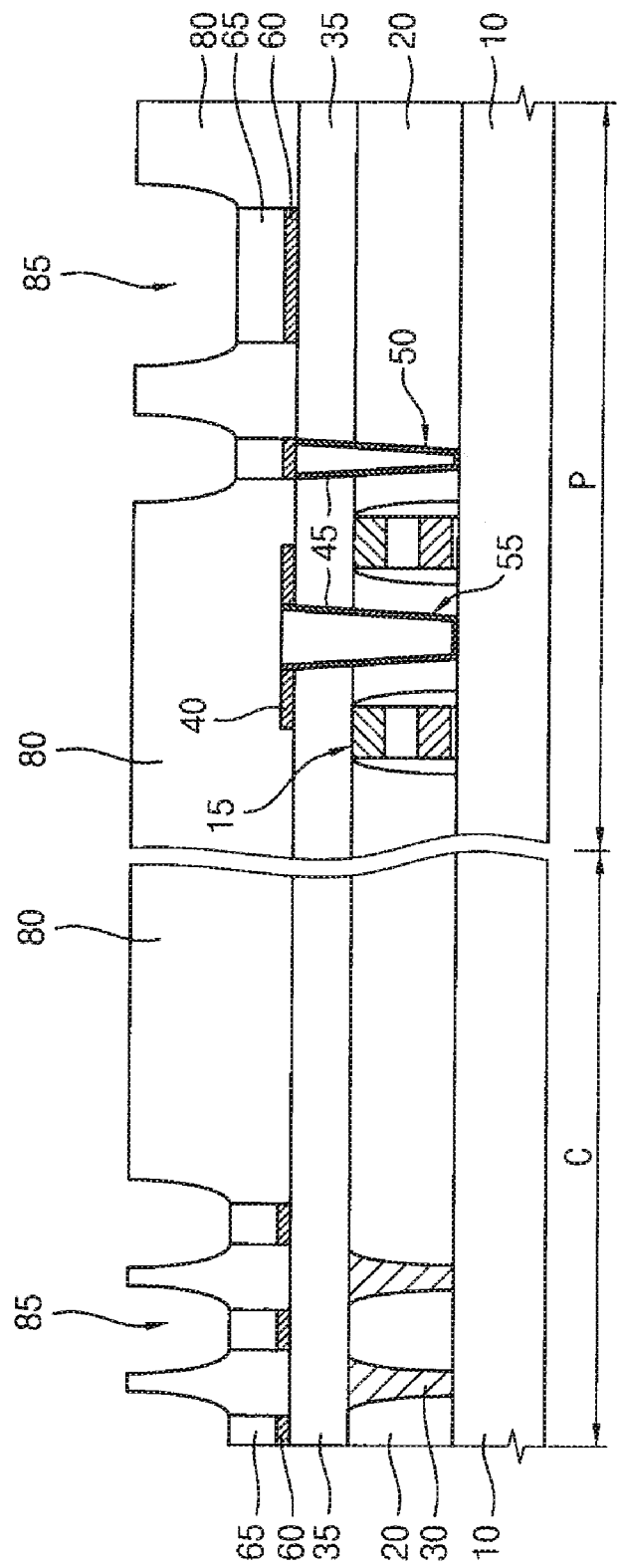
Figure 1D:
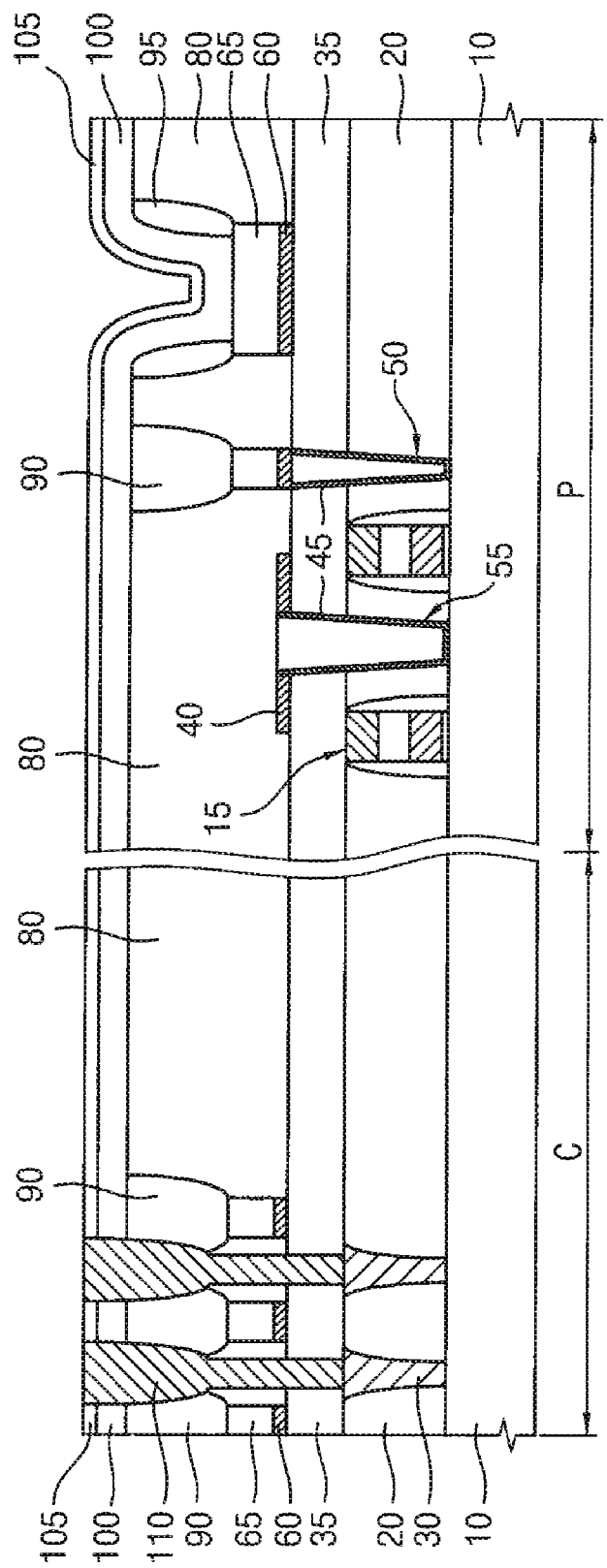
Figure 1E:
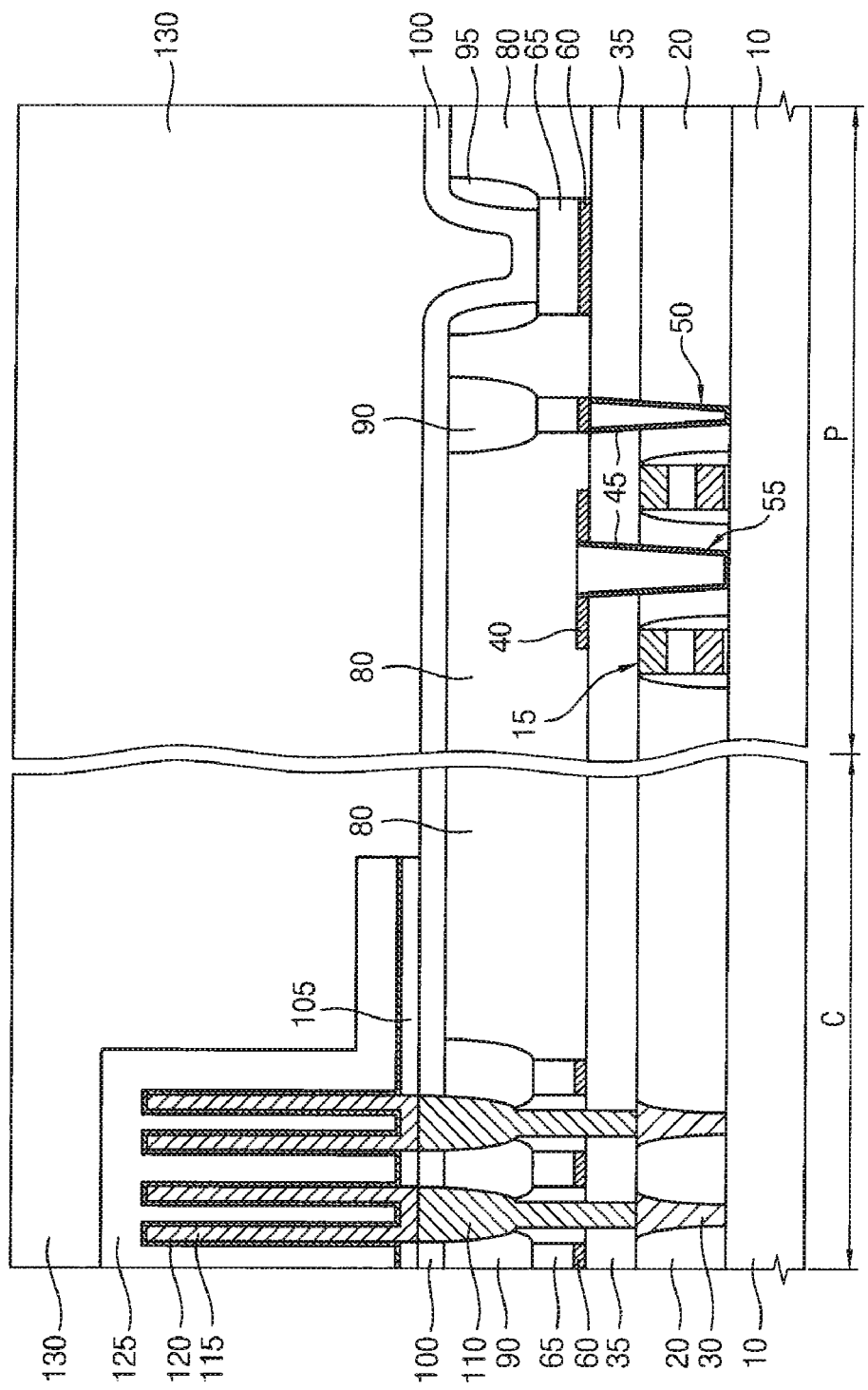
Figure 1F:
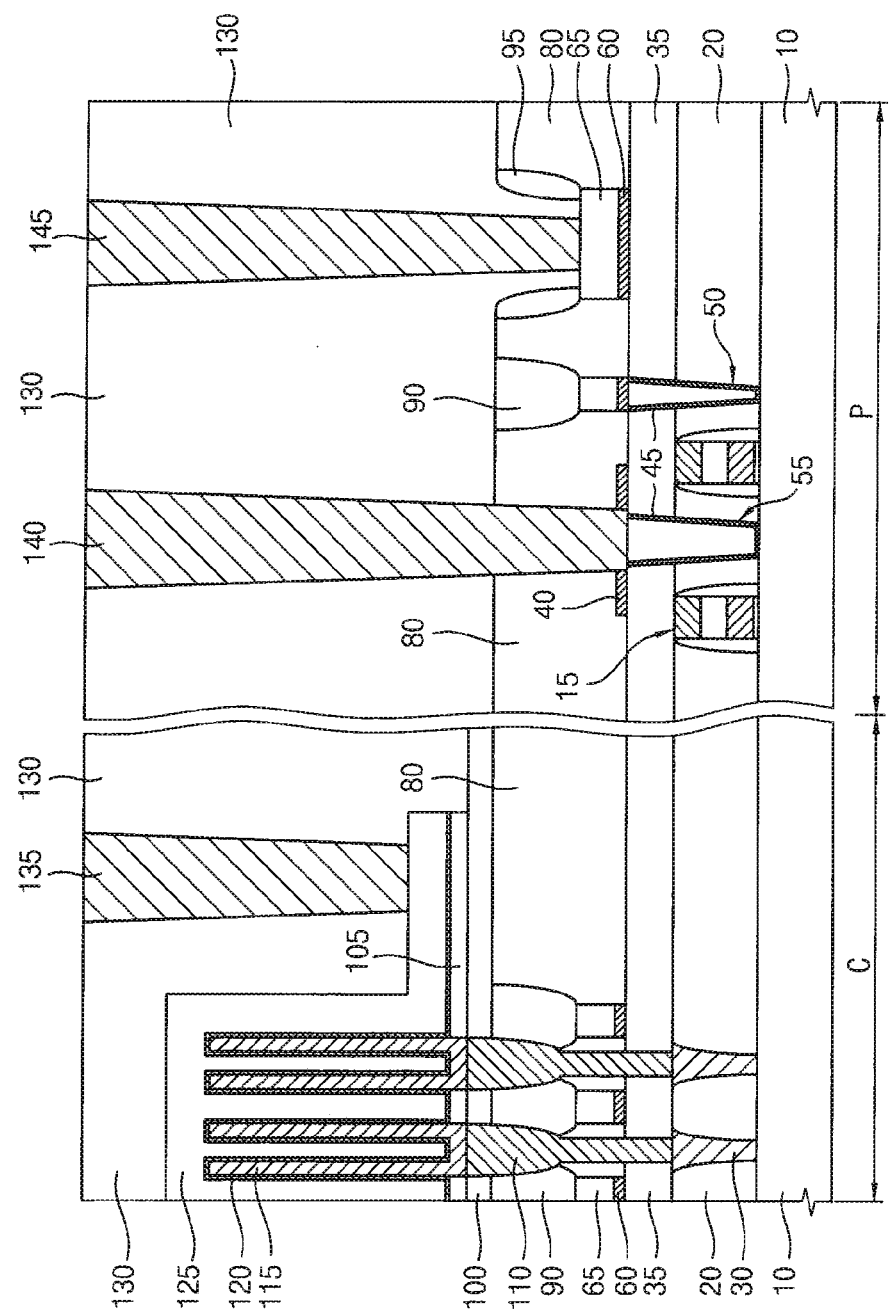

Embodiments of the present invention now will be described more fully hereinafter with reference to the accompanying drawings, in exemplary which embodiments of the invention are shown. This invention may, however, be embodied in many different forms and should not be construed as limited to the embodiments set forth herein. These embodiments are provided so that this disclosure will be thorough and complete, and will fully convey the scope of the invention to those skilled in the art. In the drawings, the thickness of layers and regions are exaggerated for clarity. Like reference numerals refer to similar or identical elements throughout. It will be understood that when an element such as a layer, region or substrate is referred to as being "on" or "onto" another element, it can be directly on the other element or intervening elements may also be present.

FIGS. 2A to 7 are cross-sectional views illustrating a method of manufacturing a semiconductor device in accordance with one embodiment of the present invention. FIGS. 2A, 2B, 3A, 3B, 4A, 4B, 5A and 5B are cross-sectional views showing a cell area of the semiconductor device, and FIGS. 2C, 3C, 4C, 5C, 6 and 7 are cross-sectional views showing a peripheral/core area of the semiconductor device corresponding to a non-cell area of the semiconductor device.

Figure 2A:
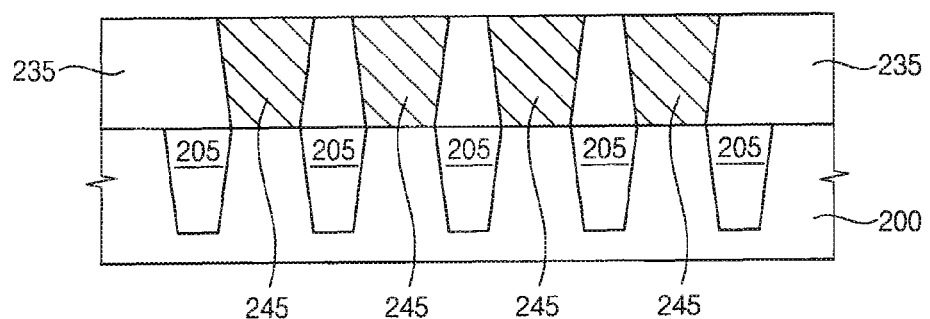
FIGS. 2A, 3A, 4A and 5A are cross sectional views taken along line I-I' in FIG. 9.
Figure 2B:
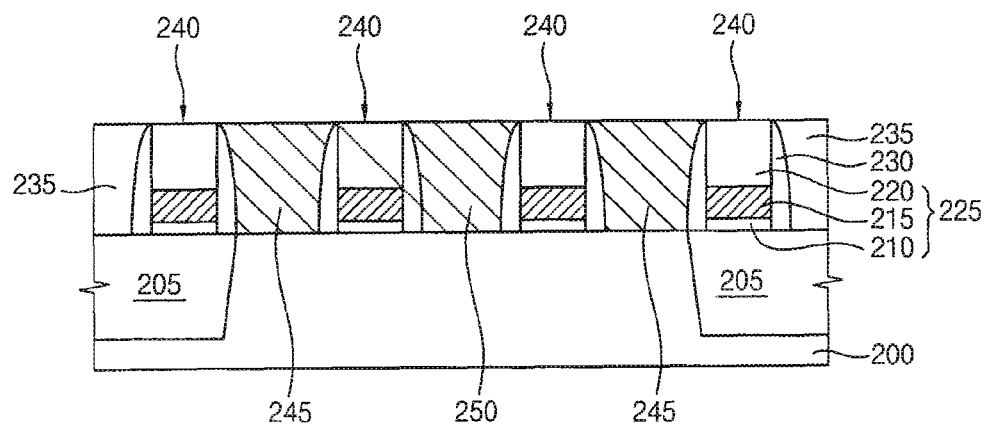
FIGS. 2B, 3B, 4B and 5B are cross sectional views taken along line II-II' in FIG. 9.

FIG. 2A is a cross-sectional view taken along the direction of a word line 240 in a cell area of the semiconductor device, and FIG. 2B is a cross-sectional view taken along the direction of a bit line 270 in the cell area of the semiconductor device. In addition, FIG. 2C is a cross-sectional view taken along the direction of the bit line 271 in a peripheral/core area of the semiconductor device.

Figure 2C:
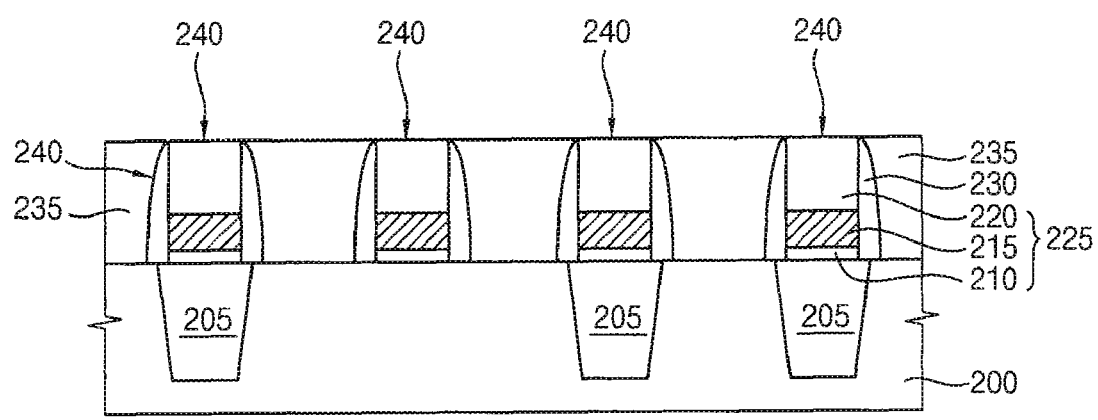
FIGS. 2C, 3C, 4C, and 5C are cross sectional views taken along line I-I' in FIG. 10.

FIGS. 2A to 2C illustrate processes of forming a first insulation interlayer 235 and contact pads 245 and 250 on a semiconductor substrate 200.

Referring to FIGS. 2A to 2C, an isolation layer 205 is formed on the substrate 200 having the cell area and the peripheral/core area to define active regions. The isolation layer 205 is formed by, for example, an isolation process such as shallow trench isolation (STI) process or a local oxidation of silicon (LOCOS) process.

A thin gate dielectric layer such as a gate oxide layer (not shown) is formed on the substrate 200 by a thermal oxidation process or a chemical vapor deposition (CVD) process. Here, the gate oxide layer is formed on the active regions of the substrate 200. The gate oxide layer will be patterned to form gate oxide patterns 215 on the substrate 200.

A first conductive layer (not shown) and a first mask layer (not shown) are successively formed on the gate oxide layer in the cell area and in the peripheral/core area. The first conductive layer is patterned to form gate conductive patterns 215 on the gate oxide patterns 210, and the first mask layer will be patterned to form gate mask patterns 220 on the gate conductive patterns 215. The first mask layer may be referred to as a gate mask layer.

In one embodiment of the present invention, the first conductive layer includes polysilicon doped with impurities. Alternatively, the first conductive layer may have a polycide structure including a doped polysilicon film pattern formed on the gate oxide pattern 210 and a metal silicide film pattern formed on the doped polysilicon film pattern.

The first mask layer includes a material having an etching selectivity relative to that of the first interlayer insulating layer 235 successively formed. For example, the first mask layer may include nitride such as silicon nitride when the first interlayer insulating layer 235 includes oxide.

The first conductive layer, the first mask layer and the gate oxide layer are successively etched by a photolithography process, thereby forming gate structures 225 including the gate oxide patterns 210, the gate conductive patterns 215 and the gate mask patterns 220, respectively. In one embodiment of the present invention, the first conductive layer, the first mask layer and the gate oxide layer are successively etched using a photoresist pattern (not shown) as an etching mask to thereby form the gate structures 225 on the substrate 200. Alternatively, after the gate mask patterns 220 are formed using a photoresist pattern as an etching mask, the photoresist pattern is removed by an ashing process and a stripping process. Then, the gate conductive patterns 215 and the gate oxide patterns 220 are formed using the gate masks 220 as etching masks so that the gate structures 225 are formed on the substrate 200.

A first insulation layer (not shown) is formed on the substrate 200 including the cell area and the peripheral/core area to cover the gate structures 225. The first insulation layer is anisotropically etched to form gate spacers 230 on sidewalls of the gate structures 225, respectively.

Impurities are implanted into portions of the substrate 200 exposed between the gate structures 225 by an ion implantation process so that source/drain regions (not shown) are formed adjacent to the gate structures 225. Thus, metal oxide semiconductor (MOS) transistors including the gate structures 225 and the source/drain regions are formed on the substrate 200. The source/drain regions formed in the cell area are divided into capacitor contact regions and bit line contact regions. The capacitor contact regions may be referred to as storage node contact regions. Capacitors are electrically connected to the capacitor contact regions, whereas bit lines 270 are electrically contacted with the bit line contact regions. As a result, a plurality of word lines 240 is formed in the cell area and the peripheral/core area of the substrate 200. Here, the word lines 240 are disposed in substantially parallel to each other. A word line 240 is electrically insulated from an adjacent word line 240 by interposing the gate spacer 230 therebetween.

In one embodiment, primary impurities are implanted into portions of the substrate 200 between the gate structures 225 at a relatively low impurity concentration before forming the gate spacers 230 on the sidewalls of the gate structures 225. Then, secondary impurities are implanted into the portions of the substrate 200 between the gate structures 225 at a relatively high impurity concentration, thereby forming source/drains of the MOS transistor having lightly doped drain (LDD) structures.

The first interlayer insulating layer 235 is formed on the cell area and the peripheral/core area of the substrate 200 to cover the word lines 240. The first interlayer insulating layer 235 is formed using oxide such as undoped silicate glass (USG), plasma-enhanced tetra-ortho silicate glass (PE-TEOS), spin on glass (SOG), high density plasma-chemical vapor deposition (HDP-CVD) oxide phosphor silicate glass (PSG), boro-phosphor silicate glass (BPSG), etc.

The first interlayer insulating layer 235 is planarized by a chemical mechanical polishing (CMP) process, an etch back process or a combination thereof. The first interlayer insulating layer 235 may be planarized until upper faces of the word lines 240 are exposed.

The planarized first interlayer insulating layer 235 is anisotropically etched to form first contact holes (not shown) that expose the source/drain regions of the MOS transistors. The first interlayer insulating layer 235, formed of a material such as oxide is partially etched using an etching gas having an etching selectivity between the first interlayer insulating layer 235 and the gate mask 220. Thus, the first contact holes exposing the source/drain regions are self-aligned with the word lines 240. Some of the first contact holes expose the capacitor contact regions (that is, the storage node contact regions), and other first contact holes expose the bit line contact regions.

A second conductive layer (not shown) is formed on the first interlayer insulating layer 235 to fill the first contact holes. The second conductive layer is formed using polysilicon doped with impurities at a high impurity concentration. The second conductive layer is etched by a CMP process, an etch back process or a combination process of CMP and etch back until gate mask patterns 220 are exposed. As a result, first storage node contact pads 245 and bit line contact pads 250 are formed in the first contact holes, respectively. Here, the first storage node contact pads 245 and the bit line contact pads 250 are referred to as self-aligned contact (SAC) pads. The first storage node contact pads 245 and the bit line contact pads 250 are electrically connected to the source/drain regions. Additionally, the first storage node contact pads 245 contact the capacitor contact regions, and the bit line contact pads 250 contact the bit line contact regions.

Figure 3A:
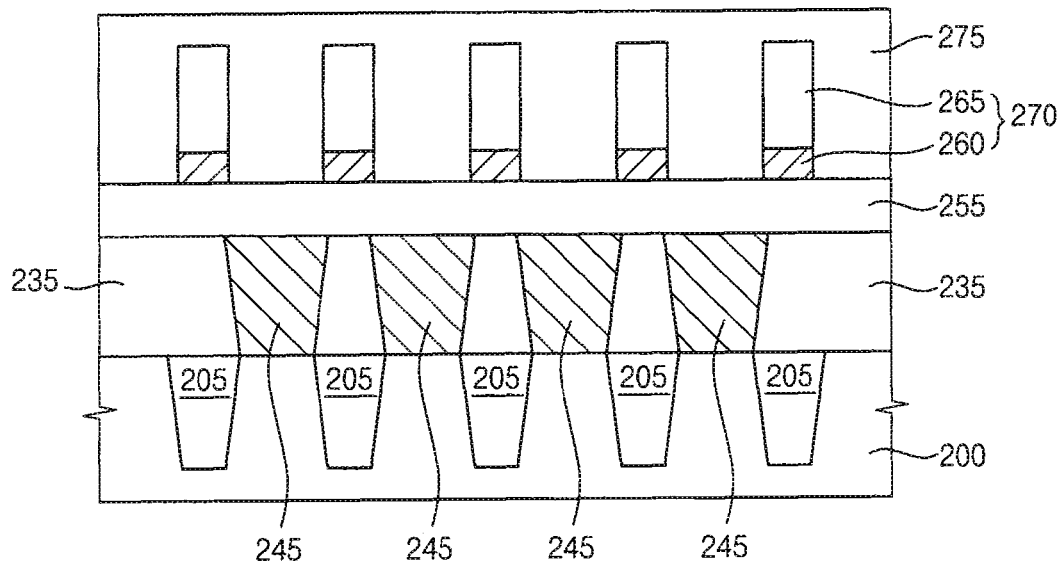
Figure 3B:
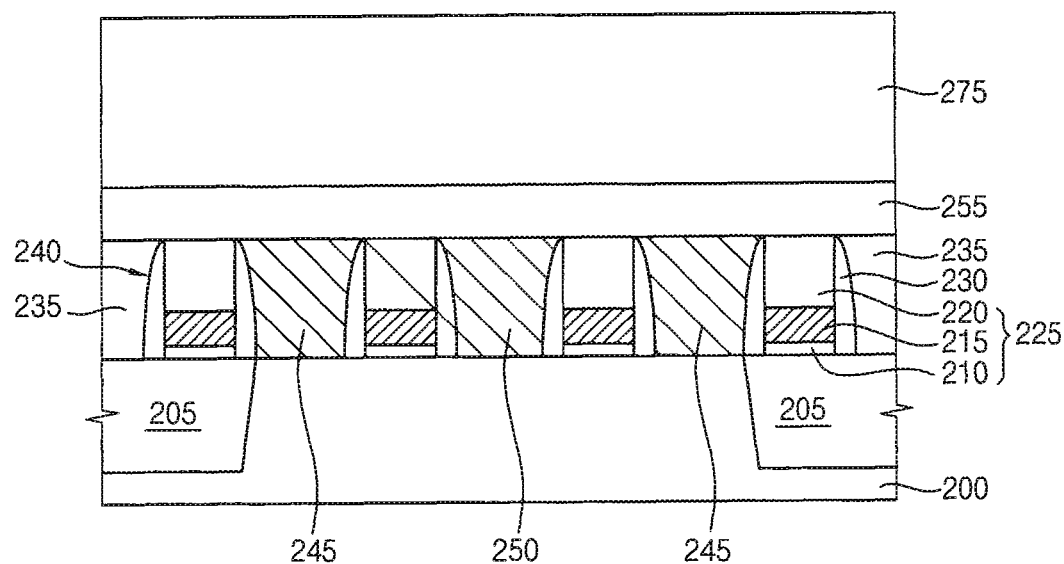
Figure 3C:
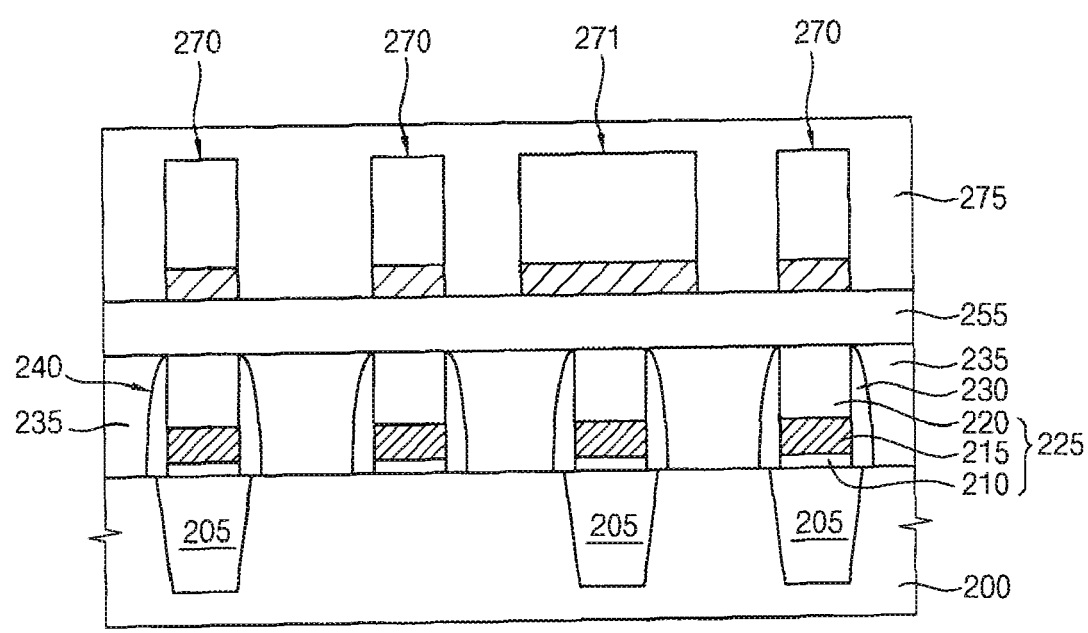

FIGS. 3A to 3C illustrate processes for forming the bit lines 270 and a third interlayer insulating layer 275 in the cell area and the peripheral/core area.

Referring to FIGS. 3A to 3C, a second interlayer insulating layer 255 is formed on the first storage node contact pads 245, on the bit line contact pads 250 and on the first interlayer insulating layer 235. The second interlayer insulating layer 255 is formed using oxide such as USG, SOG, PE-TEOS, HDP-CVD oxide, PSG, BPSG and so on. Here, the second interlayer insulating layer 255 may be formed using a dielectric material identical to that of the first interlayer insulating layer 235. Alternatively, second interlayer insulating layer 255 may be formed using a dielectric material different from that of the first interlayer insulating layer 235. The second interlayer insulating layer 255 electrically isolates the first storage node contact pads 245 from the bit lines 270. The second interlayer insulating layer 255 has a thickness of about 1,000 Å to about 3,000 Å.

To ensure a process margin of a subsequent photolithography process, the second interlayer insulating layer 255 is etched by a CMP process, an etch back process, or a combination thereof. As a result, the remaining second interlayer insulating layer 255 has a thickness of about 1,000 Å to about 2,000 Å over the word lines 240.

The remaining second interlayer insulating layer 255 is partially etched by the photolithography process to form second contact holes (not shown) exposing the bit line contact pads 250 that contact the bit line contact regions. The second contact holes may be referred to as bit line contact holes.

A third conductive layer (not shown) and a second mask layer (not shown) are successively formed on the second interlayer insulating layer 255 to fill the second contact holes. The third conductive layer and the second mask layer will be patterned to form bit line conductive patterns 260 and bit line mask patterns 265, respectively.

The second mask layer and the third conductive layer are sequentially etched by a photolithography process so that the bit lines 270 are formed on the second interlayer insulating layer 255. Each bit line 270 includes the bit line conductive pattern 260 and the bit line mask pattern 265. Alternatively, after the second mask layer is etched to form the bit line mask pattern 265, using a photoresist pattern as an etching mask, the third conductive layer is etched to form the bit line conductive pattern 260 using the bit line mask pattern 265 as an etching mask.

The bit line conductive pattern 260 may include a first layer of metal compound and a second film of metal. For example, the first layer includes titanium/titanium nitride (Ti/TiN) and the second layer includes tungsten (W). The bit line mask pattern 265 protects the bit line conductive pattern 260 in a subsequent etching process for forming storage node contact holes. For example, the bit line mask pattern 265 may include nitride.

As shown in FIG. 3C, different bit lines 270 and 271 are formed on portions of the second interlayer insulating layer 255 in the peripheral/core area of the substrate 200. Here, one bit line 270 in the peripheral/core area has a width substantially identical to that of the bit line 270 in the cell area, whereas other bit line 271 in the peripheral/core area has a width substantially wider than that of the bit line 270 in the cell area. This wide bit line 271 in the peripheral/core area corresponds to a landing pad with which a metal contact 295 will be electrically contacted. The bit lines 270 in the cell area and the peripheral/core area are disposed in a direction substantially perpendicular to the word lines 240.

Generally, the bit lines 270 correspond to wirings that detect charges stored in the capacitors of a memory cell of a semiconductor device. The bit lines 270 are electrically connected to sensing amplifiers positioned in a peripheral circuit area of the semiconductor device. Voltage variations of the bit lines 270 may be detected in accordance with detection of the charges stored in the capacitors. The voltage variations of the bit lines 270 may be reduced in accordance with an increase in the capacitance of the capacitors or a decrease in the loading capacitance of the bit lines 270. Since a sensitivity of the sensing amplifier may be improved according to the decrease in the loading capacitance of the bit line 270, the loading capacitance of the bit line 270 may be advantageously reduced so as to improve reliability and response speed of the semiconductor device.

In one embodiment of the present invention, the bit line conductive patterns 260 are directly connected to the bit line contact pads 250 through the second contact holes corresponding to the bit line contact holes.

Alternatively, bit line contact plugs contacting the bit line contact pads 250 may be formed in the bit line contact holes by filling a conductive material in the bit line contact holes. Then, the bit line conductive patterns 260 are formed on the bit line contact plugs. In particular, a barrier metal layer and a metal layer are formed on the second interlayer insulating layer 255 to fill the bit line contact holes. The barrier metal layer may include titanium/titanium nitride and the metal layer may include tungsten. The barrier metal layer and the metal layer are etched by a CMP process or an etch back process until the second interlayer insulating layer 255 is exposed, thereby forming the bit line contact plugs that fill the bit line contact holes. Thus, the bit line contact plugs directly contact the bit line contact pads 250. Then, after the third conductive layer and the second mask layer are formed on the bit line contact pads and the second interlayer insulating layer 255, the second mask layer and the third conductive layer are etched to form the bit line conductive patterns 260 and the bit line mask patterns 265. Here, each of the bit line conductive patterns 260 includes one metal film only. As a result, the bit line conductive pattern 260 is electrically connected to the bit line contact pad 250 through the bit line contact plug.

A third interlayer insulating layer 275 is formed over the substrate 200 including the bit lines 270. The third interlayer insulating layer 275 is formed using, for example, oxide such as USG, SOG, PE-TEOS, HDP-CVD oxide, BPSG, PSG and so on. As described above, the third interlayer insulating layer may be formed using a material such as oxide identical to or different from that of the first interlayer insulating layer 235 or the second interlayer insulating layer 255.

The third interlayer insulating layer 275 may be etched by a CMP process, an etch back process, or a combination thereof to planarize the third interlayer insulating layer 275.

When the third interlayer insulating layer 275 is formed on the bit line conductive patterns 260 including tungsten by using high temperature oxide deposited at a high temperature or oxide requiring a baking process, for example, BPSG or SOG after depositing on the bit line conductive patterns 260, tungsten included in the bit line conductive patterns 260 may be oxidized because sidewalls of the bit line conductive patterns 260 are exposed. To prevent the oxidation of the bit line conductive pattern 260, the third interlayer insulating layer 275 is advantageously formed on the bit line conductive pattern 260 using HDP-CVD oxide that easily covers the bit line conductive pattern 260 without a generation of a void therein.

Alternatively, a nitride layer may be formed on the bit lines 270 and on the second interlayer insulating layer 255 to prevent the generation of the void in the third interlayer insulating layer 275 between the bit lines 270 adjacent to each other. Then, the third interlayer insulating layer 275 may be formed on the nitride layer. Here, the nitride layer may have a thickness of about 50 Å to about 200 Å.

Additionally, to prevent damage to the bit lines 270 and electrical shorts between the bit lines 270 and second storage node contacts, spacers may be formed on sidewalls of the bit lines 270 in a process for forming the storage node contact holes. Here, the spacers are preferably formed using a material such as nitride that has an etching selectivity relative to the third interlayer insulating layer 275.

Figure 4A:
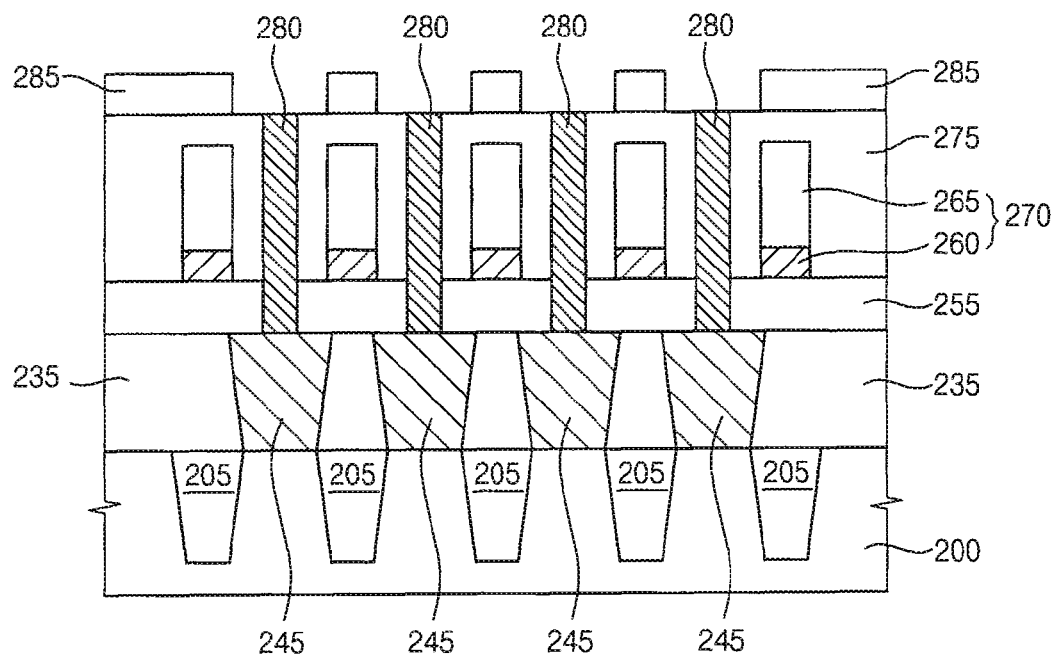
Figure 4B:
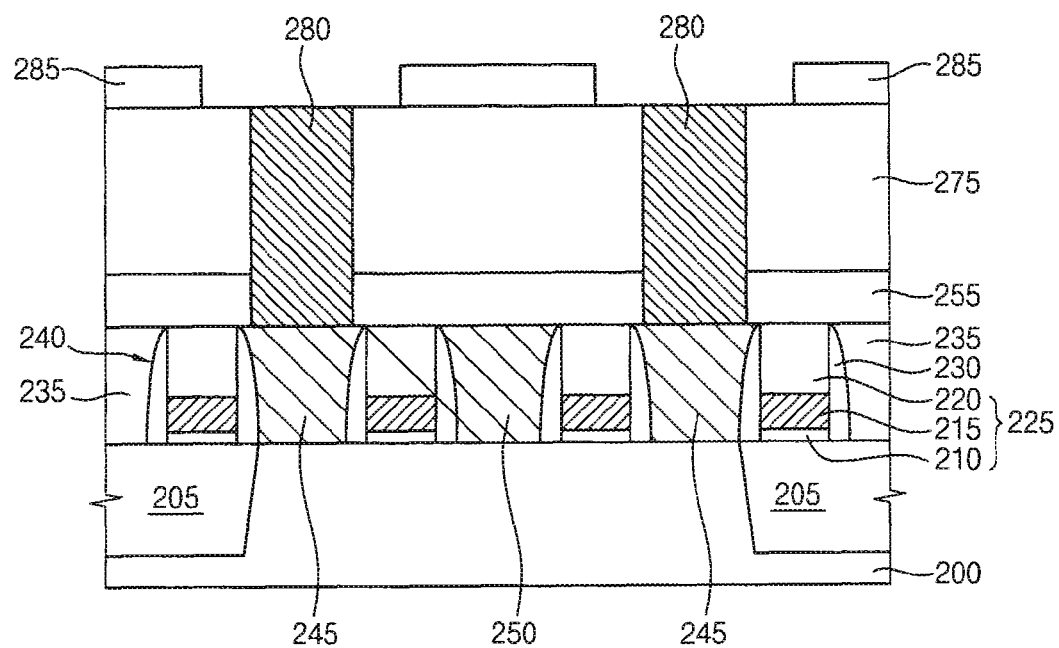
Figure 4C:
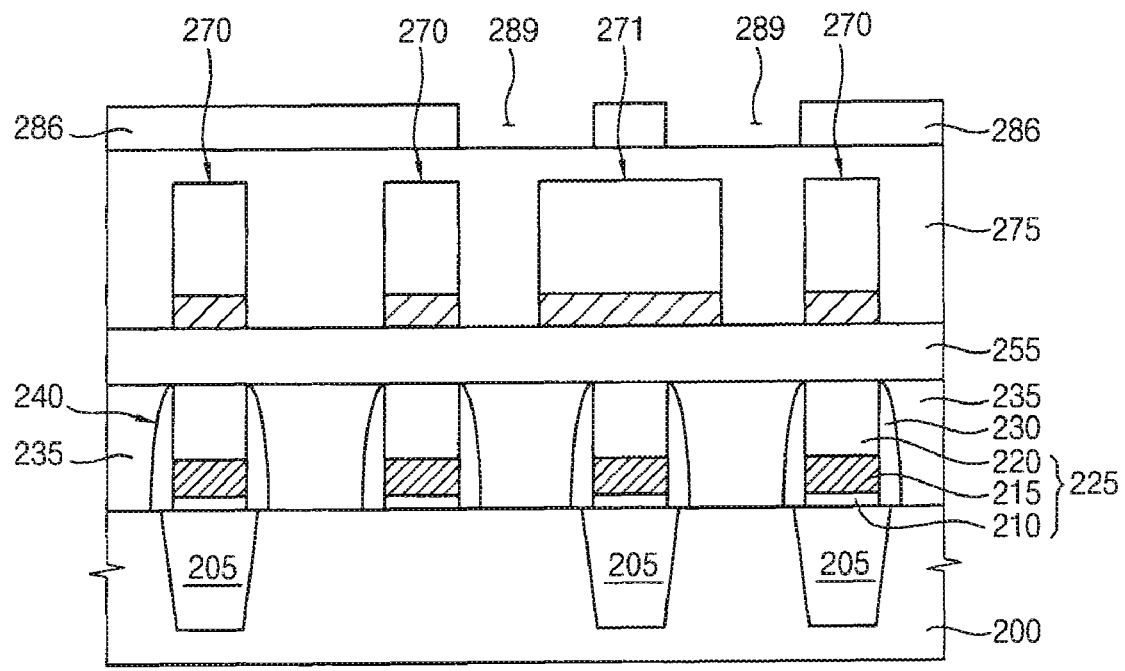

FIGS. 4A to 4C illustrate processes for forming storage node contact plugs 280 and a storage node contact pattern 285.

Referring to FIGS. 4A to 4C, the third interlayer insulating layer 275 and the second interlayer insulating layer 255 are partially etched by a photolithography process to form third contact holes (not shown) that expose the first storage node contact pads 245. The third contact holes are referred to as the storage node contact holes.

Alternatively, the storage node contact holes may be formed using the spacers by a self-alignment process. In particular, the third interlayer insulating layer 275 is partially etched to form openings at portions of the third interlayer insulating layer 275. After a nitride layer is formed on the third interlayer insulating layer 275 having the openings, the nitride layer is anisotropically etched to form the spacers on sidewalls of the openings. Then, the third interlayer insulating layer 275 and the second interlayer insulating layer 255 are etched until the first storage node contact pads 245 are exposed to form the storage node contact holes through the third interlayer insulating layer 275 and the second interlayer insulating layer 255. That is, the storage node contact holes are self-aligned with the spacers.

Additionally, the storage node contact holes may be formed using a sacrificial layer. The sacrificial layer is formed on the third interlayer insulating layer 275 and on the bit lines 270, using a material having an etching rate relative to that of the third insulation interlayer 275. For example, when the third interlayer insulating layer 275 includes HDP-CVD oxide, the sacrificial layer includes BPSG having a high impurity concentration. The sacrificial layer protects bit line conductive patterns 260 in an etching process for forming the storage node contact holes. The storage node contact holes exposing the first storage node contact pads 245 are formed by etching the sacrificial layer, the third interlayer insulating layer 275 and the second interlayer insulating layer 255. The spacers may be formed on the sidewalls of the openings formed on the third interlayer insulating layer 275 so that the storage node contact holes may be formed by the self-alignment process as described above.

In another embodiment of the present invention, an anti-reflective layer (ARL) may be formed on the third interlayer insulating layer 275 to ensure a process margin of the etching process for forming the storage node contact holes. In still another embodiment of the present invention, after forming the storage node contact holes, an additional cleaning process may be performed so as to remove a native oxide layer or particles on the first storage node contact pads 245 exposed through the storage node contact holes.

After a fourth conductive layer (not shown) is formed on the third interlayer insulating layer 275 to fill the storage node contact holes, the fourth conductive layer is etched by a CMP process, an etch back process or a combination process of CMP and etch back until the third interlayer insulating layer 275 is exposed. Hence, the storage node contact plugs 280 are formed in the storage node contact holes, respectively. The storage node contact plugs 280 may include doped polysilicon substantially similar to that of the first storage node contact pads 245.

However, the storage node contact plugs 280 are not formed in the peripheral/core area as shown in FIG. 4C.

To form second storage node contact pads 290 having, for example, rectangular shapes, a buffer layer (not shown) is formed on the storage node contact plug 280 and on the third interlayer insulating layer 275. The buffer layer is formed using a material such as oxide. The buffer layer may be etched by a photolithography process so that the storage node contact pattern 285 and a metal contact pattern 286 are formed in the cell area and the peripheral/core area of the substrate 200, respectively. The storage node contact pattern 285 and the metal contact pattern 286 partially expose the third interlayer insulating layer 275 including the storage node contact plugs 280 and the bit line landing pads 271. In the cell area of the substrate 200, the storage node contact pattern 285 is formed to expose portions of the third interlayer insulating layer 275 on which the second storage node contact pads 290 are formed. In the peripheral/core area of the substrate 200, the metal contact pattern 286 is formed to expose portions of a surface of the third interlayer insulating layer 275 under which a peripheral portion of the bit line landing pads 271 is positioned as shown in FIG. 4C.

Referring to FIG. 4C, the metal contact pattern 286 is formed at the portions of the third interlayer insulating layer 275, including a portion where metal contacts 295 will be formed.

According to another embodiment of the present invention, after the buffer layer is formed in the cell area and the peripheral/core area of the substrate 200 before forming the second storage node contact pad 290 and the metal contact 295, the buffer layer is patterned to form the storage node contact pattern 285 in the cell area and to form the metal contact pattern 286 in the peripheral/core area. The metal contact pattern 286 formed in the peripheral/core area has an opening 289 overlying an upper peripheral portion of the bit line landing pad 271. Here, the metal contact pattern 286 is partially overlapped with the bit line landing pad 271 by a misalignment margin of a subsequent process for forming the metal contact 295. That is, the process margin of the process for forming the metal contact 295 may increase in accordance with an increase in the width of the metal contact pattern 286 positioned over the bit line landing pad 271. Thus, an overlap margin of the metal contact pattern 286 relative to the bit line landing pad 271 may be greatly increased without variation of a size of the semiconductor device.

Figure 5A:
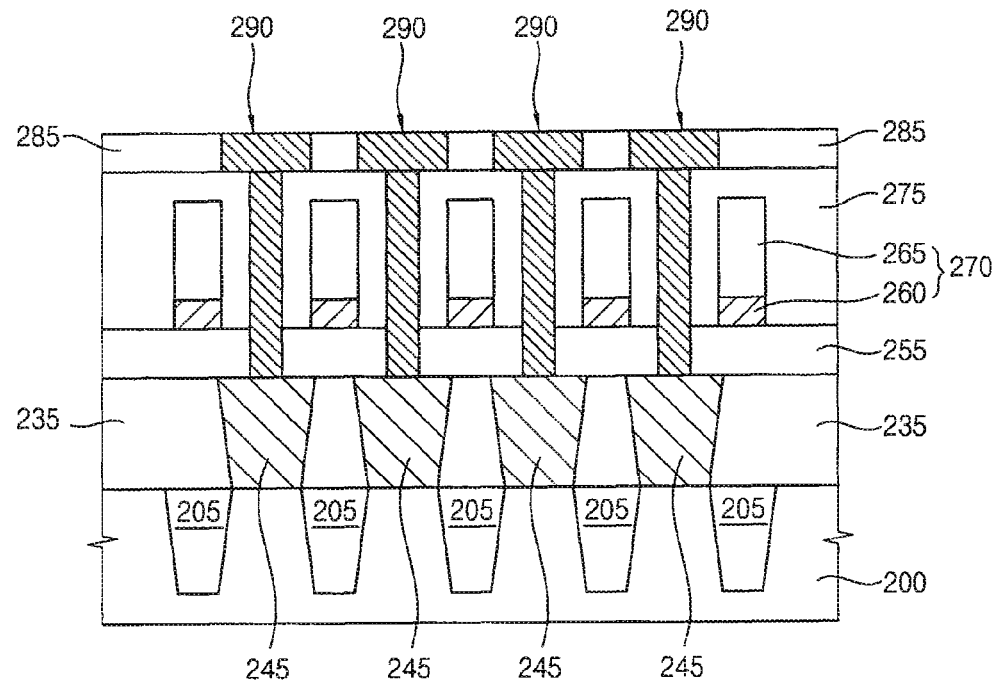
Figure 5B:
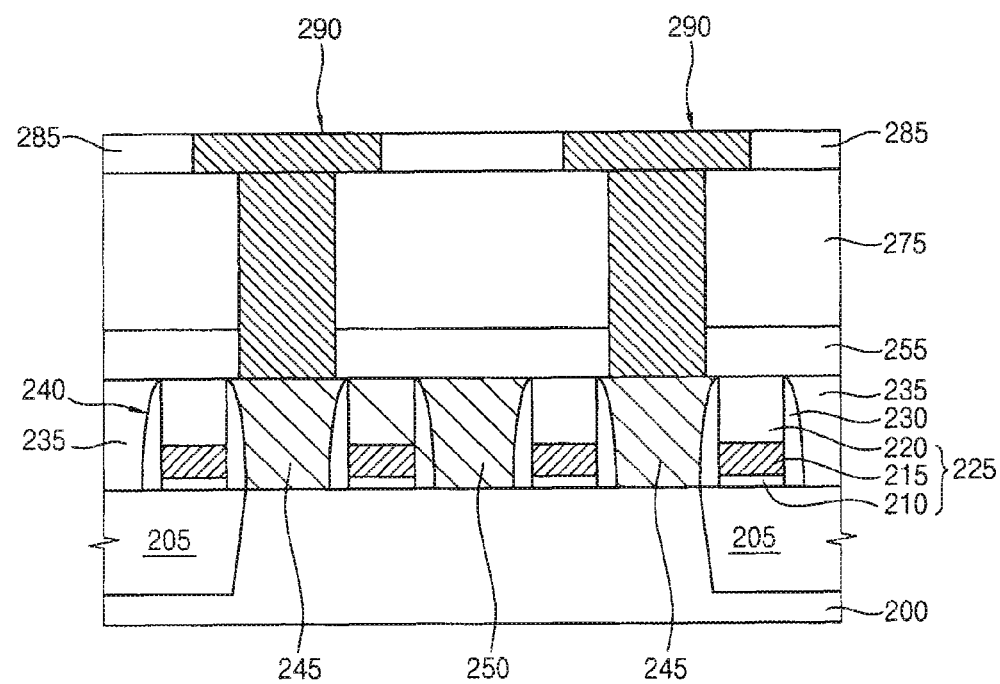
Figure 5C:
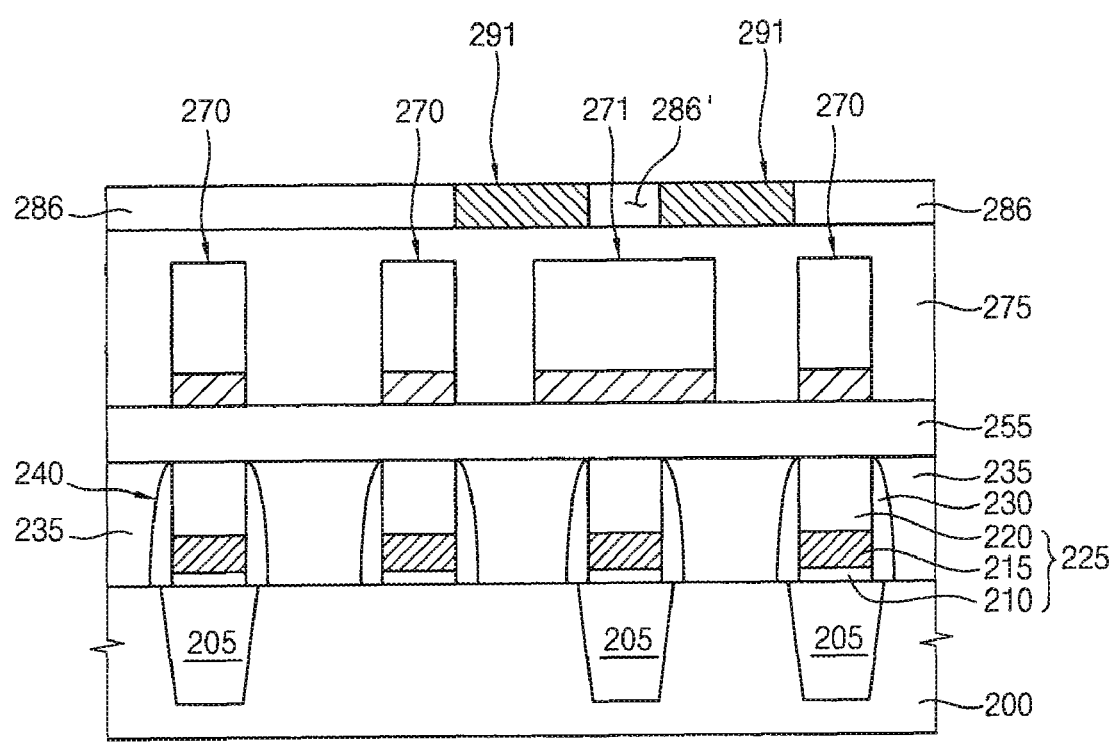

FIGS. 5A to 5C illustrate processes for forming the second storage node contact pads 290 and a fifth conductive layer pattern 291.

Referring to FIGS. 5A to 5C, a fifth conductive layer (not shown) is formed on the third interlayer insulating layer 275 exposed by the storage node contact pattern 285 and the metal contact pattern 286. For example, the fifth conductive layer is formed using doped polysilicon.

The fifth conductive layer is etched by a CMP process, and etch back process, or a combination process of CMP and etch back until the storage node contact pattern 285 and the metal contact pattern 286 are exposed, thereby forming the second storage node contact pads 290 and the fifth conductive layer pattern 291. The second storage node contact pads 290 are formed on the storage node contact plugs 280 in the cell area of the substrate 200, and the fifth conductive layer pattern 291 is formed in the metal contact pattern 286 in the peripheral/core area of the substrate 200. The fifth conductive layer pattern 291 is positioned over the bit line landing pad 271 exposed by the metal contact pattern 286. Thus, a portion 286' of the metal contact pattern 286 is positioned over a central portion of the bit line landing pad 271, and the fifth conductive layer pattern 291 is positioned over a peripheral portion of the bit line landing pad 271. In a subsequent process for forming a metal contact hole 294, after the portion of the metal contact pattern 286 corresponding to a central portion of the bit line landing pad 271 is removed, the central portion of the bit line landing pad 271 can be removed to form an opening therein. As a result, the opening that exposes a surface of the bit line conductive pattern 260 can be formed along the central portion of the bit line landing pad 271. The second storage node contact pads 290 are electrically connected to the capacitor contact regions through the storage node contact plugs 280 in the cell area. The fifth conductive layer pattern 291 is positioned over the peripheral portion of the bit line landing pad 271 in the peripheral/core area.

Figure 6:
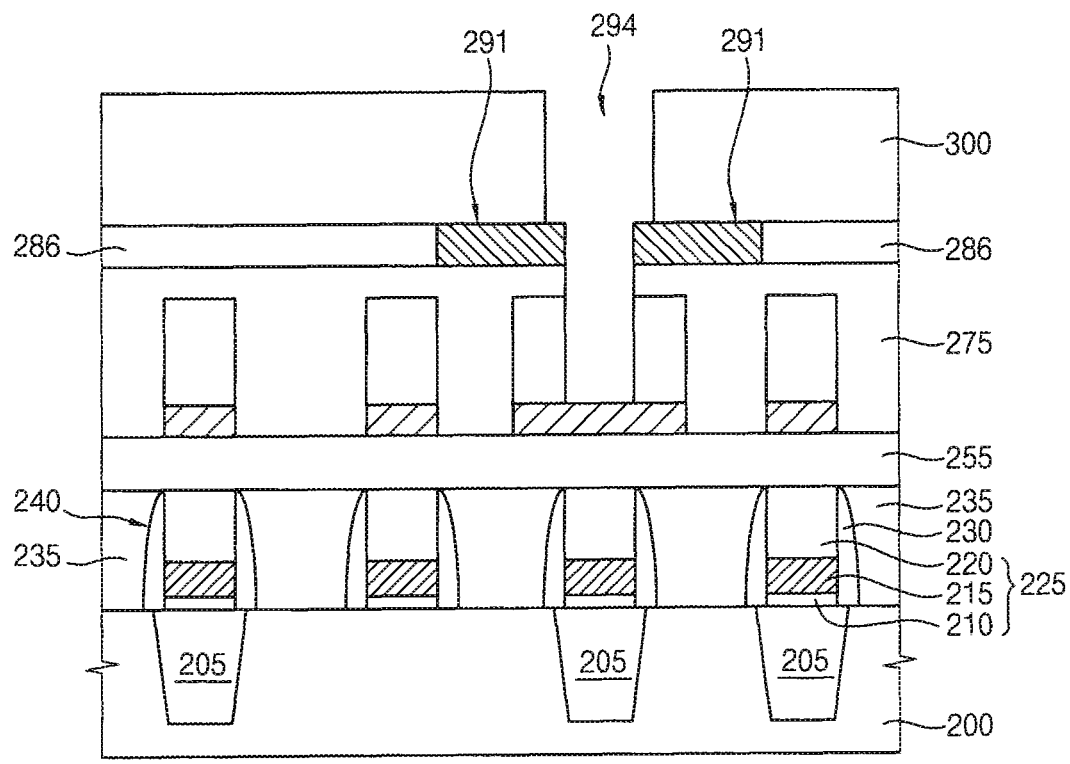
FIGS. 6 and 7 illustrate processes for forming a metal contact hole and a metal contact in the peripheral/core area of a substrate.
Figure 7:
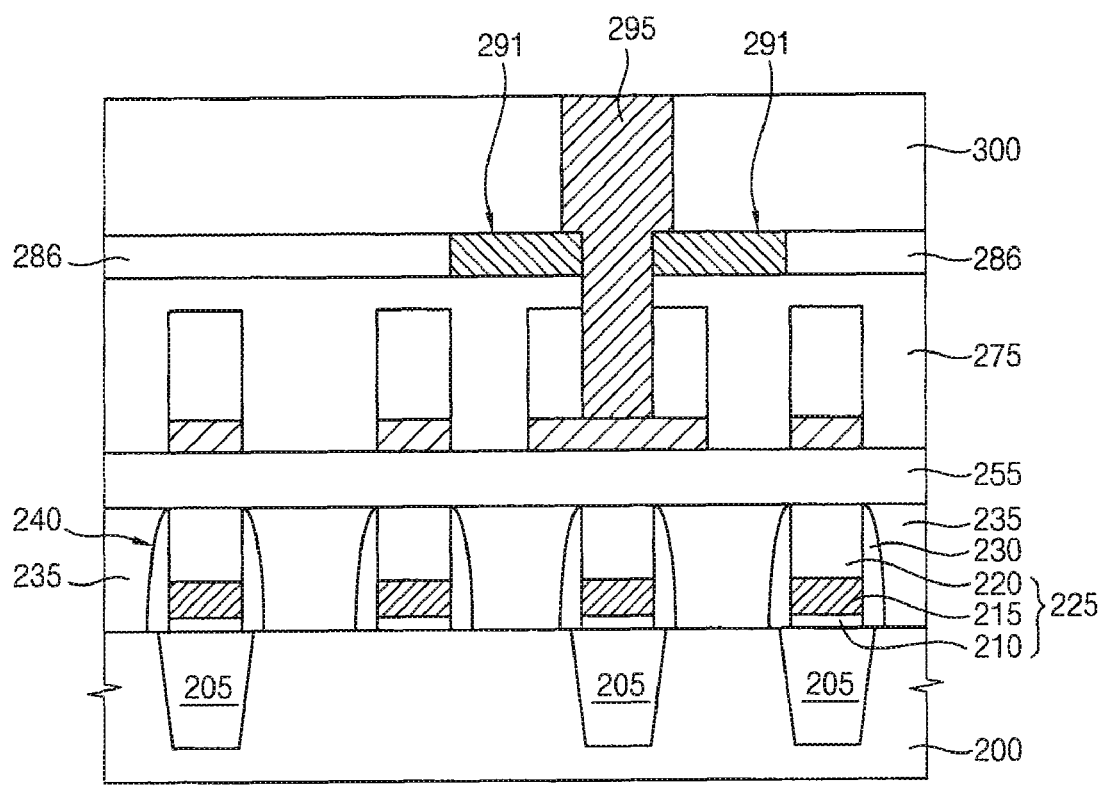
Figure 8:
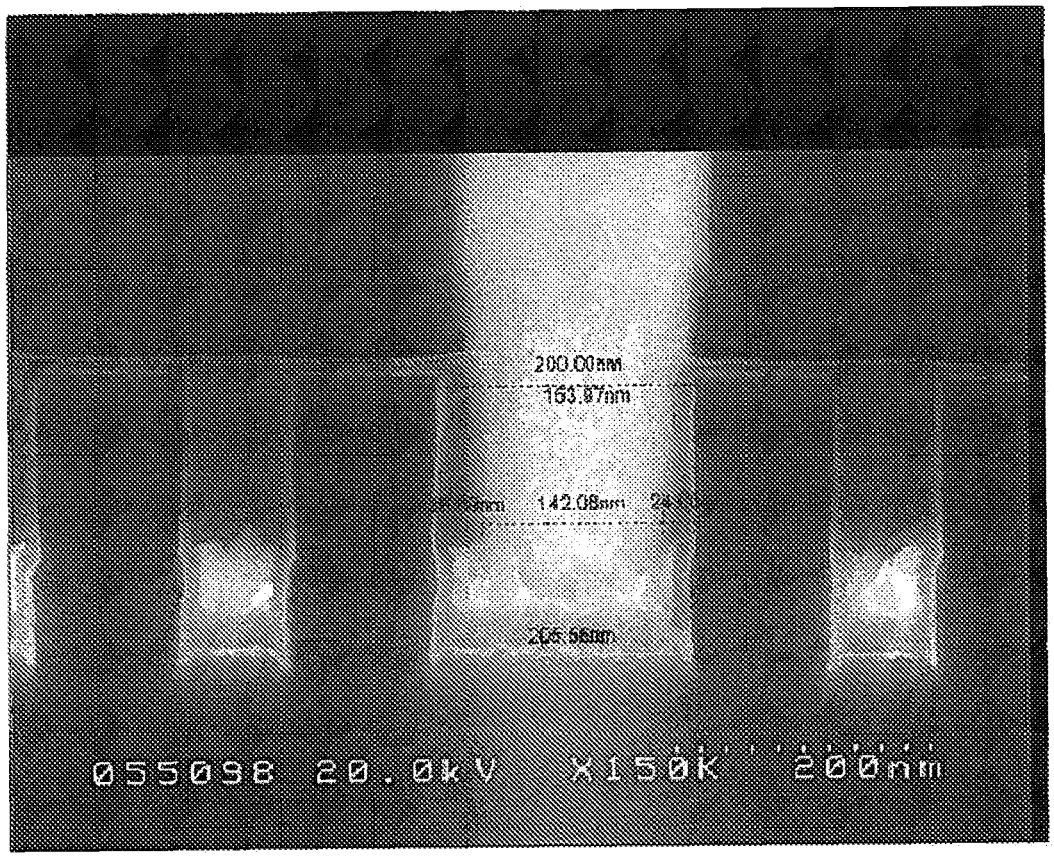
FIG. 8 is an electron microscope picture of the semiconductor device in FIG. 7.

FIGS. 6 and 7 illustrate processes for forming the metal contact hole 294 and the metal contact 295 in the peripheral/core area of the substrate 200. FIG. 8 is an electron microscope picture illustrating the semiconductor device in FIG. 7.

Although they are not shown, the capacitors are formed in the cell area of the substrate 200 in accordance with a general process for forming capacitors. Each of the capacitors includes a storage electrode formed on the second storage node contact pad 290, a dielectric layer formed on the storage electrode, and a plate electrode formed on the dielectric layer.

Referring to FIGS. 6 to 8, after forming the capacitors in the cell area of the substrate 200, a fourth interlayer insulating layer 300 is formed over an entire surface of the substrate 200. The fourth interlayer insulating layer 300, the metal contact pattern 286 and the bit line mask pattern 265 are partially etched by a photolithography process, thereby forming the metal contact hole 294 that exposes the bit line conductive pattern 260 of the bit line landing pad 271. The metal contact hole 294 may be referred to as a fourth contact hole. Here, a portion of the metal contact pattern 286 positioned over the central portion of the bit line landing pad 271 is removed to thereby form the opening that exposes the central portion of the bit line landing pad 271.

A sixth conductive layer (not shown) is formed on the fourth interlayer insulating layer 300 using doped polysilicon or tungsten to fill the metal contact hole 294. When the sixth conductive layer is etched by a CMP process, an etch back process, or a combination process thereof, the metal contact 295 is formed in the metal contact hole 294. The metal contact 295 electrically connects the bit line landing pad 271 to an upper wiring (not shown). Since the fifth conductive layer pattern 291 has an etching selectivity relative to the metal contact pattern 286, the metal contact hole 294 is self-aligned relative to the bit line landing pad 271. Therefore, the process margin for forming the metal contact 295 may be greatly improved because the metal contact 295 is self-aligned relative to the bit line landing pad 271.

Figure 9:
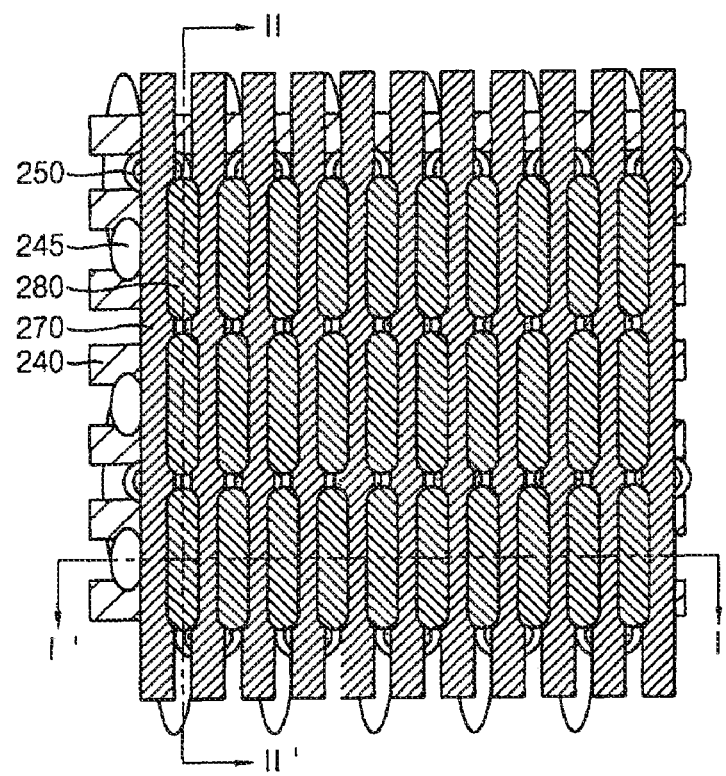
FIG. 9 is a plan view illustrating a cell area of the semiconductor device shown in FIGS. 2A, 2B, 3A, 3B, 4A, 4B, 5A and 5B.

FIG. 9 is a plan view illustrating a cell area of the semiconductor device shown in FIGS. 2A, 2B, 3A, 3B, 4A, 4B, 5A and 5B. Referring to FIG. 9, the bit line contact pad 250, the storage node contact pad 245, the storage node contact plug 280, the bit line 270 and the word line 240 are all shown. For clarity, other elements are not illustrated.

Figure 10:
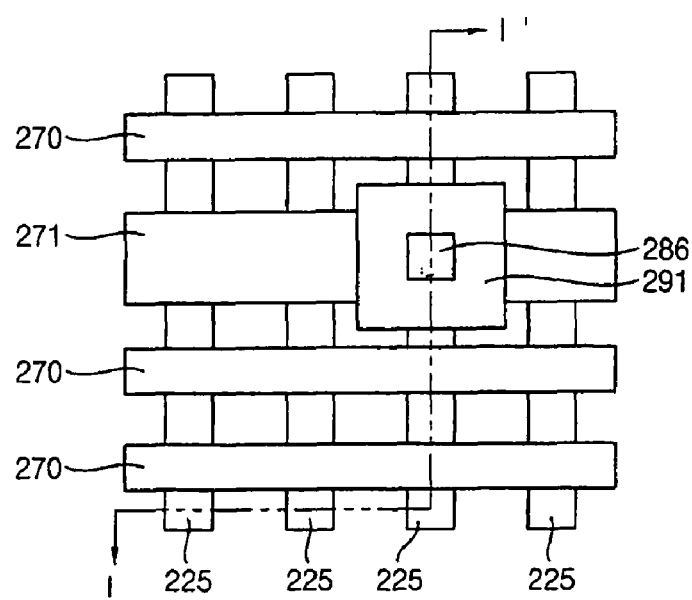
FIG. 10 is a plan view illustrating a peripheral/core area of the semiconductor device shown in FIGS. 2C, 3C, 4C and 5C.

FIG. 10 is a plan view illustrating a peripheral/core area of the semiconductor device shown in FIGS. 2C, 3C, 4C and 5C. Referring to FIG. 10, the different bit lines 270 and 271, the metal contact pattern 286, the fifth conductive layer pattern 291 and the gate structure 225 are all shown. For clarity, the metal contact pattern 286 on the third interlayer insulating layer 275 and other elements are not illustrated.

According to other embodiments of the present invention, an overlap margin of a metal contact relative to a bit line landing pad may be maximized without variations of a layout for a semiconductor device and a size of the semiconductor device, thereby correctly connecting the metal contact to the bit line landing pad. However, a process margin for forming the metal contact may be insufficient. Therefore, a failure of the semiconductor device is prevented by effectively ensuring the connection between the metal contact and the bit line landing pad. Additionally, the metal contact for connecting the bit line to an upper wiring is formed without an additional photolithography process, thus damages to the bit line and underlying structures may be effectively prevented and the process for forming the metal contact is simplified. As a result, manufacturing cost for the semiconductor device may be reduced manufacturing throughput may be improved.

Having thus described exemplary embodiments of the present invention, it is to be understood that the invention defined by the appended claims is not to be limited by particular details set forth in the above description as many apparent variations thereof are possible without departing from the spirit or scope thereof as hereinafter claimed.

What is claimed is:

1. A method of forming a semiconductor device comprising:
   forming a conductive pad in a non-cell area of a semiconductor substrate in such a manner that the conductive pad is covered with a lower insulation interlayer extending over a cell area and the non-cell area of the semiconductor substrate;
   forming a first contact pattern and a second contact pattern on the lower insulation interlayer in the non-cell area and the cell area of the semiconductor substrate, respectively, the first contact pattern having a first opening overlying a peripheral region of the conductive pad and exposing an upper surface of the lower insulation interlayer and the second contact pattern having a second opening exposing a conductive plug that extends through a portion of the lower insulation interlayer in the cell area of the semiconductor substrate;
   forming a first conductive pattern and a second conductive pattern in the first opening and the second opening, respectively, in such a manner that a portion of the first contact pattern is positioned over a central portion of the conductive pad and the first conductive pattern is positioned over a peripheral portion of the conductive pad;
   forming an upper insulation interlayer on the first and second contact patterns and on the first and the second conductive patterns;
   sequentially removing a portion of the upper insulation interlayer, a portion of the first contact pattern over the central portion of the contact pad and a portion of the lower insulation interlayer corresponding to the central portion of the contact pad, thereby forming a third opening to expose the central portion of the conductive pad; and
   forming a conductive contact extending through the third opening and being electrically connected to the conductive pad.

2. The method of claim 1, wherein forming the conductive pad further comprises:
   forming a first insulation layer on the substrate;
   forming a conductive layer on the first insulation layer;
   forming a mask layer on the conductive layer; and
   etching the mask layer and the conductive layer, thereby forming the conductive pad having a conductive pattern and a mask pattern.

3. The method of claim 1, wherein the first conductive pattern has an etching selectivity relative to the first contact pattern.

4. The method of claim 3, wherein the first contact pattern comprises oxide.

5. The method of claim 1, wherein the first conductive pattern comprises polysilicon.

6. A method of manufacturing a semiconductor device comprising:
   forming gate structures in a cell area and a non-cell area of a semiconductor substrate;
   forming a first contact region and a second contact region in the cell area of the substrate between the gate structures;
   forming a first insulation layer on the substrate;

forming first contact holes exposing the first contact region and the second contact region by partially etching the first insulation layer;

forming a first pad and a second pad in the first contact holes, wherein the first pad and the second pad contact the first contact region and the second contact region, respectively;

forming a second insulation layer on the first insulation layer, on the first pad and on the second pad in the cell area, and on the first insulation layer in the non-cell area;

forming a second contact hole exposing the second pad by partially etching the second insulation layer in the cell area;

forming a first contact contacting the second pad in the second contact hole;

forming a bit line structure on the first contact and on the second insulation layer in the cell area, and forming a bit line landing pad on the second insulation layer in the non-cell area;

forming a third insulation layer on the bit line structure and on the bit line landing pad;

forming a third contact hole exposing the first pad by partially etching the third insulation layer and the second insulation layer in the cell area;

forming a second contact contacting the first pad in the third contact hole;

forming a first contact pattern exposing the second contact on the third insulation layer in the cell area, and forming a second contact pattern for exposing a peripheral portion of the bit line landing pad on the third insulation layer in the non-cell area;

forming a third pad on the exposed second contact, and forming a conductive pattern overlying a peripheral region of the bit line landing pad, the conductive pattern having an opening to expose a substantially central region of the landing pad; and forming a metal contact contacting the bit line landing pad, the metal contact extending through the opening.

7. The method of claim 6, wherein the second and third insulation layers comprise any one selected from the group consisting of USG, SOG, PE-TEOS, HDP-CVD oxide BPSG and PSG and combinations thereof.

8. The method of claim 6, further comprising planarizing the second insulation layer and the third insulation layer by a chemical mechanical polishing process, an etch back process or a combination process of chemical mechanical polishing and etch back.

9. The method of claim 6, wherein forming the bit line structure and the bit line landing pad further comprises:
    forming a first conductive layer on the first contact and on the second insulation layer in the cell area, and on the second insulation layer in the non-cell area;
    forming a mask layer on the first conductive layer; and
    etching the mask layer and the first conductive layer to form the bit line structure including a bit line conductive pattern and a bit line mask pattern in the cell area, and to form the bit line landing pad including a bit line conductive pattern and a bit line mask pattern in the non-cell area.

10. The method of claim 6, wherein forming the bit line structure and the bit line landing pad further comprises:
    forming a first layer on the first contact and on the second insulation layer in the cell area, and on the second insulation layer in the non-cell area;
    forming a second layer on the first layer;
    forming a mask layer on the second layer; and
    etching the mask layer, the second layer and the first layer to form the bit line structure including a bit line conductive pattern and a bit line mask pattern in the cell area, and to form the bit line landing pad including a bit line conductive pattern and a bit line mask pattern in the non-cell area.

11. The method of claim 6, wherein forming the metal contact further comprises:
    forming a fourth insulation layer on the first contact pattern, on the second contact patterns, on the bit line landing pad, and on the conductive pattern; and
    forming a fourth contact hole for exposing the bit line landing pad by partially etching the fourth insulation layer and the second contact pattern.

* * * * *